United States Patent
Min et al.

(10) Patent No.: US 7,105,372 B2
(45) Date of Patent: Sep. 12, 2006

(54) MAGNETIC TUNNELING JUNCTION FILM STRUCTURE WITH PROCESS DETERMINED IN-PLANE MAGNETIC ANISOTROPY

(75) Inventors: Tai Min, San Jose, CA (US); Cheng Horng, San Jose, CA (US); Po Kang Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 10/761,003

(22) Filed: Jan. 20, 2004

(65) Prior Publication Data

US 2005/0157544 A1  Jul. 21, 2005

(51) Int. Cl.
*H01L 21/00* (2006.01)

(52) U.S. Cl. .............................. 438/48; 438/3; 438/70; 438/238; 438/241; 438/258; 257/295; 257/421; 257/422

(58) Field of Classification Search ................ 257/296, 257/3, 79, 300, 265; 368/222; 360/324.12 360/324, 324.1; 438/3, 700, 277
See application file for complete search history.

(56) References Cited

U.S. PATENT DOCUMENTS

| | | | |
|---|---|---|---|
| 5,650,958 A | 7/1997 | Gallagher et al. ........... 365/173 |
| 5,757,695 A | 5/1998 | Shi et al. ..................... 365/158 |
| 5,766,743 A | 6/1998 | Fujikata et al. ............. 428/212 |
| 5,841,692 A | 11/1998 | Gallagher et al. ........... 365/173 |
| 5,917,749 A | 6/1999 | Chen et al. .................. 365/173 |
| 5,959,880 A | 9/1999 | Shi et al. ..................... 365/158 |
| 6,166,948 A | 12/2000 | Parkin et al. ................ 365/173 |
| 6,205,052 B1 | 3/2001 | Slaughter et al. ........... 365/173 |
| 6,226,160 B1 | 5/2001 | Gallagher et al. ......... 360/324.2 |
| 6,351,410 B1 | 2/2002 | Nakao et al. ................ 365/171 |
| 6,430,084 B1 | 8/2002 | Rizzo et al. ................. 365/173 |
| 6,614,630 B1 * | 9/2003 | Horng et al. .......... 360/324.12 |
| 6,756,237 B1 * | 6/2004 | Xiao et al. ....................... 438/3 |
| 6,818,458 B1 * | 11/2004 | Gill ............................... 438/3 |
| 6,946,302 B1 * | 9/2005 | Deak .............................. 438/3 |
| 6,979,586 B1 * | 12/2005 | Guo et al. ..................... 438/48 |
| 2004/0233760 A1 * | 11/2004 | Guo et al. .................... 365/222 |

OTHER PUBLICATIONS

"Orientational Dependence of the Exchange Biasing in Molecular-Beam-Epitaxy-Grown Ni80Fe20/Fe50Mu50 Bilayers (Invited)," by Jungblut et al., pp. 6659-6664, 1994 American Institute of Physics, May 15, 1994, J. Appl. Phys. 75(10).

* cited by examiner

*Primary Examiner*—Nathan J. Flynn
*Assistant Examiner*—Fazli Erdem
(74) *Attorney, Agent, or Firm*—Saile Ackerman LLC; Stephen B. Ackerman

(57) ABSTRACT

A method of forming an MTJ memory cell and/or an array of such cells is provided wherein each such cell has a small circular horizontal cross-section of 1.0 microns or less in diameter and wherein the ferromagnetic free layer of each such cell has a magnetic anisotropy produced by a magnetic coupling with a thin antiferromagnetic layer that is formed on the free layer. The MTJ memory cell so provided is far less sensitive to shape irregularities and edge defects than cells of the prior art.

14 Claims, 1 Drawing Sheet

MAGNETIC TUNNELING JUNCTION FILM STRUCTURE WITH PROCESS DETERMINED IN-PLANE MAGNETIC ANISOTROPY

This application is related to application Ser. No. 10/872,915, filed on Jun. 21, 2004, now issued as U.S. Pat. No. 6,979,586, and is also related to to, a Divisional of the former application, application Ser. No. 11/210,637, filed on Aug. 25, 2005.

BACKGROUND OF THE INVENTION

1. Field of the Invention

This invention relates to the design and fabrication of magnetic tunnel junctions (MTJ) as memory storage devices, particularly to a design wherein coercivity and anisotropy are decoupled from the cell shape of the junction and can be independently optimized.

2. Description of the Related Art

The magnetic tunnel junction (MTJ) basically comprises two electrodes, which are layers of ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, however, depending on the availability of tunneling states with different electron spin orientations. Thus, the overall tunneling current will depend on the number of spin-up vs. spin-down electrons, which in turn depends on the orientation of the electron spin relative to the magnetization direction of the ferromagnetic layers. Thus, if these magnetization directions are varied for a given applied voltage, the tunneling current will also vary as a function of the relative directions. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel or antiparallel configurations (writing) and that these two configurations can be sensed by tunneling current variations or resistance variations (reading). In practice, the free ferromagnetic layer can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of current carrying lines called word lines and bit lines (or word lines and sense lines). When both lines are activated, the device is written upon, ie, the magnetization direction of its free layer is changed. When only one line is activated, the resistance of the device can be sensed, so the device is effectively read. Such an MTJ device is provided by Gallagher et al. (U.S. Pat. No. 5,650,958), who teach the formation of an MTJ device with a pinned ferromagnetic layer whose magnetization is in the plane of the layer but not free to rotate, together with a free magnetic layer whose magnetization is free to rotate relative to that of the pinned layer, wherein the two layers are separated by an insulating tunnel barrier layer.

In order for the MTJ MRAM device to be competitive with other forms of DRAM, it is necessary that the MTJ be made very small, typically of sub-micron dimension. Such a small area cell is provided by Gallagher et al. (U.S. Pat. No. 6,226,160 B1) who make use of a tunnel barrier layer formed of an oxidized thin aluminum layer. Parkin et al. (U.S. Pat. No. 6,166,948) notes that sub-micron dimensions are needed to be competitive with DRAM memories in the range of 10–100 Mbit capacities. Parkin also notes that such small sizes are associated with significant problems, particularly super-paramagnetism, which is the spontaneous thermal fluctuation of magnetization in samples of ferromagnetic material too small to have sufficient magnetic anisotropy (a measure of the ability of a sample to maintain a given magnetization direction). It is also undesirable for MTJ devices to have excessive magnetic coupling between adjacent magnetic layers of neighboring devices or even within the same device as this coupling must be overcome when writing on the device. One source of such undesirable coupling results from the non-planar surfaces at the interfaces of ferromagnetic layers, such as might occur between the fixed and free layer of an MTJ. This is known as topological coupling. Slaughter et al. (U.S. Pat. No. 6,205,052 B1) teaches a way of reducing such topological coupling by forming an additional layer between a base metal and a spacer layer, the additional layer being crystallographically amorphous with respect to x-ray scattering analysis.

Some degree of anisotropy is necessary if an MTJ cell is to be capable of maintaining a magnetization direction and, thereby, to effectively store data even when write currents are zero. As cell sizes have continued to decrease, the technology has sought to provide a degree of magnetic anisotropy by forming cells in a wide variety of shapes (eg. rectangles, diamonds, ellipses, etc.), so that the lack of inherent crystalline anisotropy is countered by a shape anisotropy. Yet this form of anisotropy brings with it its own problems. A particularly troublesome shape-related problem in MTJ devices results from non-uniform and uncontrollable edge-fields produced by shape-anisotropy (a property of non-circular samples). As the cell size decreases, these edge fields become relatively more important than the magnetization of the body of the cell and have an adverse effect on the storage and reading of data. Although such shape anisotropies, when of sufficient magnitude, reduce the disadvantageous effects of super-paramagnetism, they have the negative effect of requiring high currents to change the magnetization direction of the MTJ for the purpose of storing data. To counteract these edge effects, Shi et al. (U.S. Pat. No. 5,757,695) teaches the formation of an ellipsoidal MTJ cell wherein the magnetization vectors are aligned along the length (major axis) of the cell and which do not present variously oriented edge domains, high fields and poles at the ends of the element. In addition, the fabrication processes required to produce the shape varieties, eg. photolithography and ion-milling, are incapable of controlling the shaping with sufficient precision to prevent variations in cell sizes, shapes and aspect ratios and, in addition, cause uncontrollable defects along the edges of the cells. The randomness of all these defects lead to a wide distribution in switching field coercivities (the fields required to change the logic state of an MTJ cell) and can even cause unwanted and uncontrollable coupling between cells. One attempt to reduce edge effects is provided by Nakao et al. (U.S. Pat. No. 6,351,410 B1), who form ring shaped MTJ electrodes to cause the induced magnetic fields to be circumferential.

As has been discussed, many of the problems associated with the construction of MRAM arrays are related to the shapes of the cells and the processes required to form those shapes. Cell shapes of present designs are typically single element rectangle, elliptical or lozenge. Any irregularities of these shapes, or defects at their edges produced during their formation, will result in coercivity fluctuations distributed throughout the array. An alternative approach to providing magnetic anisotropies without the necessity of utilizing shapes which are difficult to fabricate, is to produce a magnetic anisotropy in a ferromagnetic layer by forming it on an antiferromagnetic layer. In this way, a magnetic coupling can be produced between the ferromagnetic and antiferromagnetic layers which will provide the required magnetic anisotropy. In "Orientational dependence of the exchange biasing in molecular-beam-epitaxy-grown $Ni_{80}Fe_{20}/Fe_{50}Mn_{50}$ bilayers" (R. Jungblut, R. Coehoorn, M. T. Johnson, J. aan de Stegge and A. Reinders, J. Appl. Phys. 75(10), 15 May 1994, pp. 6659–6664), experimental results are provided to show that interfacial exchange energy between such layers can be utilized to provide a biasing effect which lowers coercivity (as indicated by hysteresis loop shifts) in crystal growth directions. Fujikata et al. (U.S. Pat. No. 5,766,743) provide a magnetoresistance effect film having two ferromagnetic layers separated by a non-magnetic layer wherein one of the ferromagnetic layers is formed on an antiferromagnetic layer. The antiferromagnetic layer is at least partly made of a NiMn alloy having a face-centered tetragonal structure and it provides a biasing magnetic field, Hr, which exceeds the coercive force, $Hc_2$, of the other ferromagnetic layer. The purpose of the antiferromagnetic layer is to provide domain stabilization of the free layer and, as a result the antiferromagnetic layer is not formed over the active region of the free layer. In a related invention, Rizzo et al. (U.S. Pat. No. 6,430,084 B1) teach the formation of bit and digit lines (the lines whose currents write and read the MTJ devices) which are clad with shielding ferromagnetic and antiferromagnetic layers to prevent inadvertent switching of adjacent MTJ cells. In the structure provided by Rizzo, the antiferromagnetic layer stabilizes the magnetization of the ferromagnetic layer by exchange coupling and thereby improves the shielding effect. It is the object of the present invention to utilize the magnetic coupling properties of antiferromagnetic layers with ferromagnetic layers to provide the necessary magnetic anisotropy to form an MTJ memory cell capable of advantageously storing data without the necessity of obtaining the anisotropy through the route of shape anisotropy.

SUMMARY OF THE INVENTION

A first object of this invention is to provide a novel MTJ device whose magnetization switching properties are insensitive to shape irregularities and edge defects and which can be used to form an MRAM array.

A second object of this invention is to provide an MRAM array of such MTJ devices, in which array coercivity variations and resulting switching field variations due to shape irregularities and edge defects in the MTJ devices is eliminated or greatly reduced.

A third object of this invention is to provide an MRAM cell array design which is less dependent on the shape of individual cell elements for its performance.

A fourth object of this invention is to provide an MTJ cell which can be formed with a substantially circular shape of sub-micron dimension using even square shaped masks for cell patterning.

These objects will be achieved by a design method that decouples cell magnetization anisotropy from cell shape and cell layer thickness. In accord with the method, the cell shape can be circular in its horizontal cross-section, which is a particularly simple shape to fabricate and whose shape variations can be easily controlled. In fact, for small enough dimensions (less than 1.0 microns), a simple square mask design will almost necessarily create a substantially circular cell pattern. The success of the method is based on the fact that a very thin antiferromagnetic material layer (less than 20 angstroms thick) grown on a ferromagnetic material layer can render the magnetization of the ferromagnetic layer effectively magnetically anisotropic (before the unidirectional anisotropy is fully developed) within the plane of its formation by means of magnetic coupling across the interface between the two layers. The method proposes that a ferromagnetic free layer of an MTJ device be formed, with a circular shape, beneath a "top" thin antiferromagnetic layer. Although the circular shape will provide no shape anisotropy and although the small size of the free layer will provide no crystalline anisotropy, the top antiferromagnetic layer formed on the free layer will provide an anisotropic magnetic coupling. Since no shape anisotropy is required, the MTJ cell can be formed with dimensions less than 1.0 microns using even a square mask design, which at such small dimensions will produce a patterned cell that is substantially circular. The free layer can be a single layer of ferromagnetic material or it can be formed as a synthetic ferromagnetic layer with a top layer of antiferromagnetic material. The magnetization of the top antiferromagnetic layer will be set in the same direction as the bottom antiferromagnetic layer that pins the fixed ferromagnetic layer of the MTJ device. The magnetizations will be set in the same magnetic field and at the same temperature.

DESCRIPTION OF THE PREFERRED EMBODIMENT

The preferred embodiment of the present invention teaches a method of forming an MTJ device (also called an MTJ memory cell) as one of an MRAM cell array of such devices, the ferromagnetic free layer of each such device having a magnetic anisotropy created by magnetic coupling through their interface with an antiferromagnetic layer.

Figure 1A:
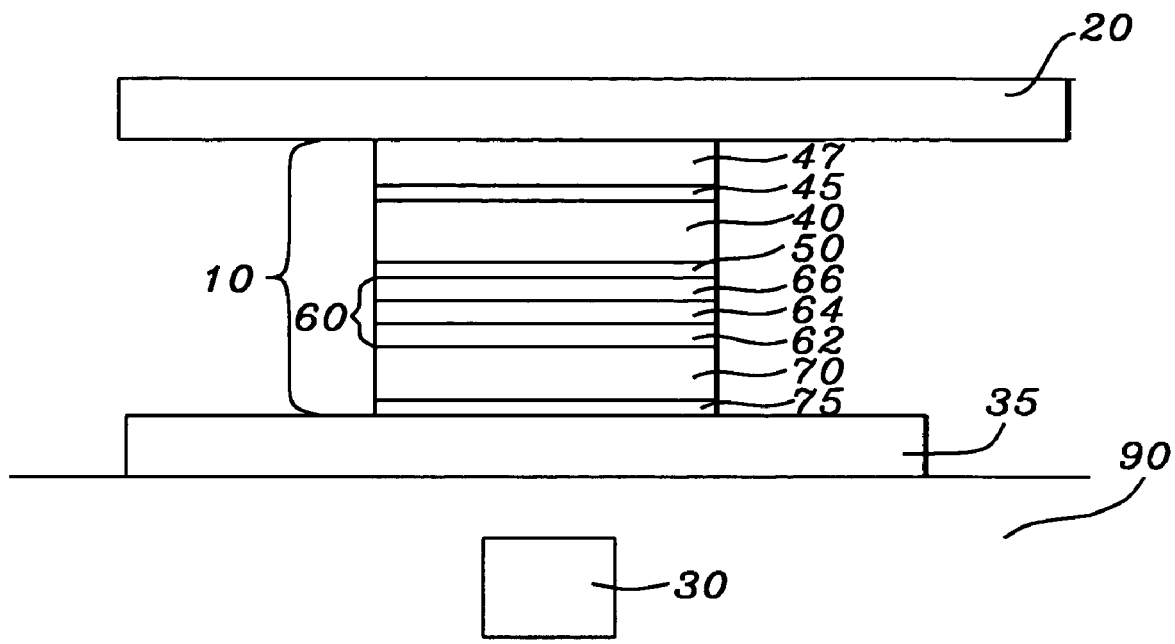
FIG. 1a is a schematic illustration of a single MTJ device formed in accord with the method of the present invention. The device is shown (in vertical cross-section) at the intersection of a word line and a bit line and it is understood that it can be one of a plurality of such devices forming a MRAM array.

Referring to FIG. 1a, there is shown a schematic vertical cross-sectional view of an MTJ cell (10) formed in accord with the method of the present invention. The cell is disposed between a substantially planar substrate, which contains a word line (30) that is insulated (90) from the cell and a bit line (20), which contacts an upper portion of the cell and which runs orthogonally to the word line. A lower conducting electrode (35) contacts a lower portion of the cell and is required for reading operations. The cell is thereby positioned at an orthogonal junction between the word and bit lines and is disposed between them. An overhead view of the MTJ cell shown schematically in FIG. 1b discloses the substantially circular horizontal cross-sectional shape of the preferred embodiment, which is not seen in this vertical cross-section.

Referring to FIG. 1a, there is shown a ferromagnetic free layer (40) separated by an insulating tunneling layer (50) from a magnetically pinned layer (60). The magnetically free layer is preferably a layer of Co, Ni, Fe or their alloys, CoFeB, CoZrB, CoTaB or CoHfB and is formed to a thickness between approximately 3 and 300 angstroms. The insulating tunneling layer is preferably a layer of $Al_2O_3$, $ZrO_2$, AlN, $HfO_2$ or multilayers thereof and said tunneling barrier layer is formed to a thickness between approximately 3 and 30 angstroms A layer of metallic antiferromagnetic material (45), having the optimal thickness disclosed below, is formed on top of the free layer. This "top" antiferromagnetic layer, upon a subsequent annealing in an external magnetic field, will provide magnetic anisotropy within the plane of the free layer without substantial exchange coupling. The top antiferromagnetic layer (45) can be a layer of IrMn, RhMn, RuMn, OsMn, FeMn, FeMnCr, FeMnRh, CrPtMn, TbCo, NiMn, PtMn or PtPdMn and it is preferentially formed to a thickness between approximately 2 and 20 angstroms, within which range the magnetic anisotropy of the free layer is found to be optimized. A capping layer (47), which can be a layer of Ru, Rh, Ti, Ta, NiCr, NiFeCr, Cr, Cu, Au or Ag, is formed on the top antiferromagnetic layer to protect the top antiferromagnetic layer from oxidation or other process damage during subsequent processing steps. The pinned layer (60) can be a single magnetic layer or, as is the case in this preferred embodiment, a synthetic antiferromagnetic (SyAF) multilayer, comprising a first ferromagnetic layer (62) and a second ferromagnetic layer (66) separated by a coupling layer (64) formed of non-magnetic coupling material such as Rh, Ru, Cr or Cu. 5. Ferromagnetic layers (62) and (66) suitable for the objects of this preferred embodiment are layers of Co, Ni, Fe or their alloys or CoFeB, formed to thicknesses between approximately 5 and 100 angstroms. An appropriate coupling layer is a layer of Ru, formed to a thickness between approximately 7 and 8 angstroms or a layer of Rh formed to a thickness between approximately 5 and 6 angstroms.

The magnetizations of the first and second ferromagnetic layers are coupled in antiparallel directions and pinned by a "bottom" antiferromagnetic layer (70) formed of the same antiferromagnetic material as used in the top antiferromagnetic layer, but with a different range of thickness so as to provide a pinning mechanism due to magnetic exchange coupling. The bottom antiferromagnetic layer is formed on a seed layer (75), for improvement of its structure. The seed layer material suitable for this embodiment can include NiFe, NiCr, NiFeCr, Cu, Ti, TiN, Ta, Ru, or Rh. The seed layer is shown as being formed on a lower conducting electrode (35), which is required for read operations, but whose structure and composition is not an essential part of the present invention.

The material composition and thicknesses of the first and second ferromagnetic layers of the pinned layer (60), as noted above, are chosen so that their magnetizations are essentially equal in magnitude. Thus, when they are fixed in opposite directions, the net magnetic moment of the pinned layer is substantially zero. It is understood that the fixing of the SyAF magnetizations and the pinning of the SyAF pinned layer to the bottom antiferromagnetic layer is achieved by an annealing process in an external magnetic field. It is also understood that this same annealing process also serves to couple the top antiferromagnetic layer to the free ferromagnetic layer by a magnetic interaction across the interface between the aforesaid two layers, said coupling providing the free layer with a magnetic anisotropy. Annealing parameters consistent with the preferred embodiment include an external magnetic field between 100 and 20,000 Oe, applied at a temperature between 100° and 400° C. for a time between 0.5 and 20 hours. It is further understood that the material and thickness of the top antiferromagnetic layer has been chosen to optimize the coercivity of the free layer while providing it with a substantially zero unidirectional magnetic field. Since the MTJ of the type described herein requires no shape anisotropy, it can be patterned so that its horizontal cross-section has a substantially circular shape, which in the preferred embodiment is approximately 1.0 microns or less in diameter. In accord with the objects of the present invention, such patterning can be done using photolithographic and ion-milling or reactive ion etch (RIE) methods well know to those skilled in the art, wherein the photolithographic mask is square or circular. Patterning is done preferentially after completion of the annealing process.

Figure 1B:
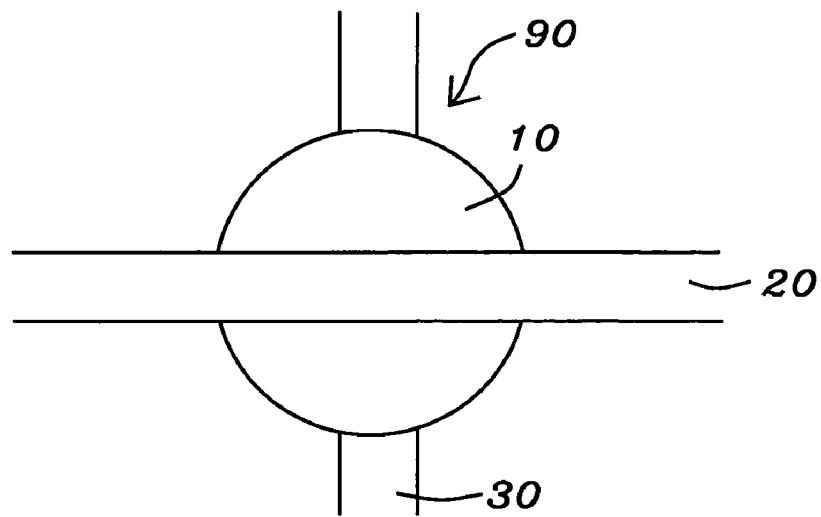
FIG. 1b shows an overhead view of FIG. 1a, indicating the substantially circular horizontal cross-section of the MTJ device.

Referring to FIG. 1b, there is shown the device (cell) of FIG. 1a, in an overhead view, showing the circular horizontal cross-section of the device and the orthogonal intersection of the bit and word lines above and below the device.

As is understood by a person skilled in the art, the preferred embodiment of the present invention is illustrative of the present invention rather than being limiting of the present invention. Revisions and modifications may be made to methods, processes, materials, structures, and dimensions through which is formed an MTJ device having a free layer with magnetic anisotropy provided by magnetic coupling with an antiferromagnetic layer, while still providing an MTJ element having a free layer with magnetic anisotropy provided by magnetic coupling with an antiferromagnetic layer, formed in accord with the present invention as defined by the appended claims.

What is claimed is:

1. A method for forming an MTJ memory cell having a substantially circular horizontal cross-section, wherein a ferromagnetic free layer in said cell has uniaxial magnetic anisotropy provided by exchange coupling with a top antiferromagnetic layer formed thereon comprising:

providing a substrate;

forming on said substrate a layered magnetic tunneling junction (MTJ) structure, said formation further comprising:

forming on said substrate a seed layer;

forming on said seed layer an antiferromagnetic pinning layer;

forming on said antiferromagnetic pinning layer a synthetic antiferromagnetic (SyAF) pinned layer;

forming on said pinned layer a tunneling barrier layer;

forming on said tunneling barrier layer a ferromagnetic free layer;

forming on said ferromagnetic free layer said top antiferromagnetic layer;

forming on said top antiferromagnetic layer a capping layer;

annealing said layered MTJ structure in an external magnetic field, thereby pinning said SyAF layer and exchange coupling said top antiferromagnetic layer to said ferromagnetic free layer to produce, thereby, a uniaxial magnetic anisotropy in said free layer;

patterning said layered MTJ structure to create a horizontal cross-sectional shape that is substantially circular.

2. The method of claim 1 wherein said seed layer is a layer of NiFe, NiCr, NiFeCr, Cu, Ti, Ta, Ru, Rh, TiN, TiW, W or TaW formed to a thickness between approximately 5 and 500 angstroms.

3. The method of claim 1 wherein said antiferromagnetic pinning layer is a layer of the antiferromagnetic material IrMn, RhMn, RuMn, OsMn, FeMn, FeMnCr, FeMnRh, CrPtMn, TbCo, NiMn, PtMn or PtPdMn and it is formed to a thickness between approximately 40 and 400 angstroms.

4. The method of claim 1 wherein said SyAF pinned layer is formed by a method further comprising:

forming a first layer of ferromagnetic material on said antiferromagnetic pinning layer;

forming a coupling layer on said first ferromagnetic layer;

forming a second layer of ferromagnetic material on said coupling layer.

5. The method of claim 4 wherein said first and second ferromagnetic layers are layers of Co, Ni, Fe or their alloys or CoFeB, formed to thicknesses between approximately 5 and 100 angstroms.

6. The method of claim 4 wherein said coupling layer is a layer of Ru, formed to a thickness between approximately 7 and 8 angstroms or a layer of Rh formed to a thickness between approximately 5 and 6 angstroms.

7. The method of claim 1 wherein said tunneling barrier layer is a layer of $Al_2O_3$, $ZrO_2$, AlN, $HfO_2$ or multilayers thereof and said tunneling barrier layer is formed to a thickness between approximately 3 and 30 angstroms.

8. The method of claim 1 wherein said ferromagnetic free layer is a layer of Co, Ni, Fe or their alloys, CoFeB, CoZrB, CoTaB or CoHfB formed to a thickness between approximately 3 and 300 angstroms.

9. The method of claim 1 wherein said top antiferromagnetic layer is a layer of IrMn, RhMn, RuMn, OsMn, FeMn, FeMnCr, FeMnRh, CrPtMn, TbCo, NiMn, PtMn or PtPdMn and it is formed to a thickness to optimize the uniaxial anisotropy of the ferromagnetic free layer.

10. The method of claim 9 wherein said top antiferromagnetic layer is a layer of IrMn, RhMn, RuMn, OsMn, FeMn, FeMnCr, FeMnRh, CrPtMn, TbCo, NiMn, PtMn or PtPdMn formed to a thickness between approximately 2 and 20 angstroms.

11. The method of claim 1 wherein said annealing comprises raising the MTJ structure to a temperature between approximately 100° C. and 400° C. for a time between approximately 0.5 and 20 hours in an external magnetic field between approximately 100 and 20,000 Oe.

12. The method of claim 1 wherein said patterning produces a circular horizontal cross-section with a diameter of approximately 1.0 microns or less.

13. The method of claim 1 wherein said substrate is a planarized layer of insulation containing therein a conducting word line and wherein said MTJ structure is formed substantially over said word line.

14. The method of claim 13 wherein a bit line is formed over said MTJ structure in a direction orthogonal to said word line.

* * * * *